United States Patent
Yoon et al.

(10) Patent No.: US 9,117,733 B2
(45) Date of Patent: Aug. 25, 2015

(54) LIGHT EMITTING MODULE AND LIGHTING APPARATUS HAVING THE SAME

(71) Applicant: POSCO LED COMPANY LTD., Seongnam-si (KR)

(72) Inventors: Seong Bok Yoon, Seongnam-si (KR); Dae Won Kim, Seongnam-si (KR)

(73) Assignee: Posco LED Company Ltd., Seongnam-si (KR)

( * ) Notice: Subject to any disclaimer, the term of this patent is extended or adjusted under 35 U.S.C. 154(b) by 49 days.

(21) Appl. No.: 14/101,654

(22) Filed: Dec. 10, 2013

(65) Prior Publication Data

US 2015/0108517 A1    Apr. 23, 2015

(30) Foreign Application Priority Data

Oct. 18, 2013  (KR) .................. 10-2013-0124851
Oct. 18, 2013  (KR) .................. 10-2013-0124859

(51) Int. Cl.
  *H01L 27/15*  (2006.01)
  *H01L 33/62*  (2010.01)

(52) U.S. Cl.
  CPC ............ *H01L 27/156* (2013.01); *H01L 33/62* (2013.01)

(58) Field of Classification Search
  CPC .................................... H01L 31/143
  See application file for complete search history.

(56) References Cited

U.S. PATENT DOCUMENTS

| 6,514,782 | B1* | 2/2003 | Wierer, Jr. et al. ............. 438/22 |
| 6,547,249 | B2* | 4/2003 | Collins et al. .................. 257/88 |
| 6,641,294 | B2* | 11/2003 | Lefebvre ........................ 362/544 |
| 6,957,899 | B2* | 10/2005 | Jiang et al. ...................... 362/84 |
| 7,009,199 | B2* | 3/2006 | Hall ................................... 257/14 |
| 7,034,470 | B2* | 4/2006 | Cok et al. ........................ 315/249 |
| 7,834,364 | B2* | 11/2010 | Lee .................................. 257/82 |
| 7,936,135 | B2* | 5/2011 | Hum et al. ...................... 315/307 |
| 8,680,533 | B2* | 3/2014 | Sakai et al. ....................... 257/76 |
| 2001/0007360 | A1* | 7/2001 | Yoshida et al. ................... 257/89 |
| 2002/0158261 | A1* | 10/2002 | Lee et al. ........................ 257/88 |

FOREIGN PATENT DOCUMENTS

| JP | 2009-009846 | 1/2009 |
| JP | 2009-152636 | 7/2009 |
| JP | 2013-065692 | 4/2013 |
| KR | 10-1033008 | 5/2011 |
| KR | 20-0468108 | 7/2013 |

* cited by examiner

*Primary Examiner* — Lex Malsawma
(74) *Attorney, Agent, or Firm* — H.C. Park & Associates, PLC

(57) ABSTRACT

A light emitting module according to an exemplary embodiment of the present invention includes a printed circuit board (PCB) and first through m-th lighting blocks ('m' is an integer greater than one). The PCB has wiring patterns electrically connecting optical semiconductor devices. The first through the m-th lighting blocks are disposed on the PCB and configured to generate light. Each of the first through the m-th lighting blocks includes first through n-th lighting groups (each block includes at least one group), each of which includes optical semiconductor devices disposed on the PCB, and an electric currents configured to flow through each lighting group is substantially the same.

10 Claims, 8 Drawing Sheets

LIGHT EMITTING MODULE AND LIGHTING APPARATUS HAVING THE SAME

CROSS-REFERENCE TO RELATED APPLICATIONS

This application claims priority from and the benefit of Korean Patent Application Nos. 10-2013-0124851, filed on Oct. 18, 2013, and 10-2013-0124859, filed on Oct. 18, 2013, which are hereby incorporated by reference for all purposes as if fully set forth herein.

BACKGROUND OF THE INVENTION

1. Field of the Invention

Exemplary embodiments of the present invention relate to a light emitting module and a lighting apparatus having the light emitting module. More particularly, exemplary embodiments of the present invention relate to a light emitting module generating light by using optical semiconductor devices and a lighting apparatus having the light emitting module.

2. Discussion of the Background

Conventionally, an indoor lighting apparatus installed in a ceiling or a wall of a house or an office adopts an incandescent light bulb or a fluorescent lamp. However, the incandescent light bulb or the fluorescent lamp has demerits such as a short life time, low brightness, low energy efficiency, etc. Therefore, recently a lighting apparatus adopting light emitting diodes (LEDs) with relatively long life time, high brightness, high energy efficiency, etc. increases its market share.

The lighting apparatus with LEDs is widely used in applications such as a desk lamp, a flash lamp, or a surface lighting apparatus installed in a ceiling.

FIG. 1 is a schematic cross-sectional view illustrating a lighting apparatus, and FIG. 2 is a bottom view illustrating the lighting apparatus in FIG. 1.

A mother printed circuit board (PCB) may be separated into two PCBs 110, each of which has a body 111 and plurality of elbows 112. A plurality of optical semiconductors 120 may be disposed in a matrix shape on the PCB 110. However, lengths of an output wiring connecting the optical semiconductors 120 may be different from each other. Therefore, voltage drops of the output wiring may be different, and induce electric current deviation to cause brightness deviation among optical semiconductors 120.

SUMMARY OF THE INVENTION

Exemplary embodiments of the present invention provide a light emitting module and a lighting apparatus, which are capable of eliminating brightness deviation among optical semiconductor devices.

A light emitting module according to an exemplary embodiment of the present invention includes a printed circuit board (PCB) and a first through an m-th lighting block ('m' is an integer greater than one). The PCB has wiring patterns for electric connection of optical semiconductor devices. The first through the m-th lighting block are disposed on the PCB and generating light by provided electric power. Each of the first through the m-th lighting block comprises a first through an n-th lighting group ('n' is an integer equal to or greater than one), each of which comprises a plurality of optical semiconductor devices disposed on the PCB, and electric currents flowing through each lighting group are same.

For this, the first through the n-th lighting group of the first through the m-th lighting block may be electrically connected with each other in series, and the optical semiconductor devices in each of the first through the n-th lighting group of the first through the m-th lighting block may be electrically connected with each other in parallel.

For example, a last lighting group of a (k−1)-th lighting block ('k' is an integer, and 2≤k≤m) may be electrically connected with a first lighting group of a k-th lighting block in series.

For example, each of the lighting groups may include same number of optical semiconductor devices.

On the other hand, the PCB may include a plus connector and a minus connector for proving the optical semiconductor devices with electric power.

And a first lighting group of the first lighting block may be electrically connected to the plus connector and the last lighting group of the m-th lighting block is electrically connected to the minus connector.

For example, the PCB may include m-number of elbows and a body connecting the elbows, and each elbow may correspond to each lighting block.

Alternatively, the PCB may include a pair of bodies spaced apart from each other and m-number of elbows connecting the pair of bodies, and each elbow corresponds to each lighting block.

In this case, a last lighting group of an i-th elbow may be electrically connected to a last lighting group of an (i+1)-th elbow ('i' is an odd number smaller than m), and a first lighting group of j-th elbow may be electrically connected to a first lighting group of an (j+1)-th elbow ('j' is an even number smaller than m).

A lighting apparatus according to an exemplary embodiment of the present invention includes a base plate and a light emitting module. The base plate has a rectangular shape. The light emitting module includes a printed circuit board (PCB) disposed on the base plate and a plurality of optical semiconductor devices disposed on the PCB. The PCB has a body and m number of elbows ('m' is an integer greater than one) integrally formed with the body. The m number of elbows are spaced apart with opening portion interposed therebetween so that the elbows and the openings are disposed alternately. Each of the elbows includes n number of lighting groups, each of the lighting group having same number of optical semiconductor devices, and electric currents flowing through each lighting group are same.

The lighting groups may be electrically connected with each other in series, and the optical semiconductor devices in each of the lighting groups may be electrically connected with each other in parallel.

In this case, a last lighting group of a (k−1)-th elbow ('k' is an integer, and 2≤k≤m) may be electrically connected with a first lighting group of a k-th elbow in series.

Alternatively, a last lighting group of an i-th elbow may be electrically connected to a last lighting group of an (i+1)-th elbow ('i' is an odd number smaller than m), and a first lighting group of j-th elbow may be electrically connected to a first lighting group of an (j+1)-th elbow ('j' is an even number smaller than m).

For example, the body may be disposed in parallel with an edge portion of the base plate, and has at least one connector.

For example, the m number of elbows may be disposed in parallel with an edge portion of the base plate, and one of the elbows has at least one connector.

For example, the base plate may be coated with a material with white color or silver color to have high optical reflectivity.

The lighting apparatus may further include a power supply disposed on opposite surface that is opposite to a surface on which the PCB is disposed.

Additionally, the lighting apparatus may further include an optical cover combined with the base plate to diffuse light generated by the optical semiconductor devices.

According to the light emitting module and the lighting apparatus of the present invention, brightness deviation of the optical semiconductor devices is eliminated.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
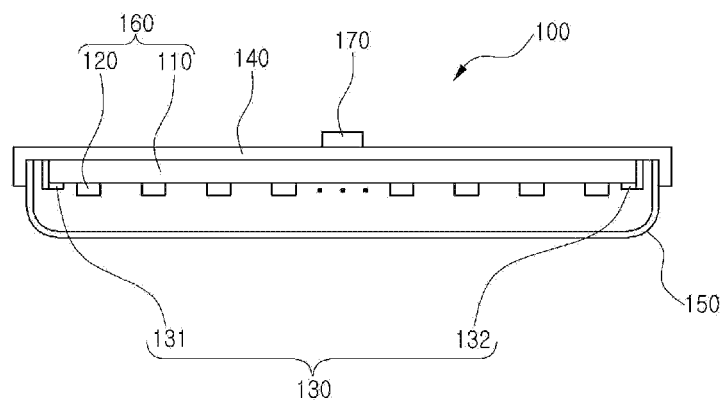
FIG. 1 is a schematic cross-sectional view illustrating a lighting apparatus according to an exemplary embodiment of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be described in detail with reference to the accompanying drawings.

Figure 2:
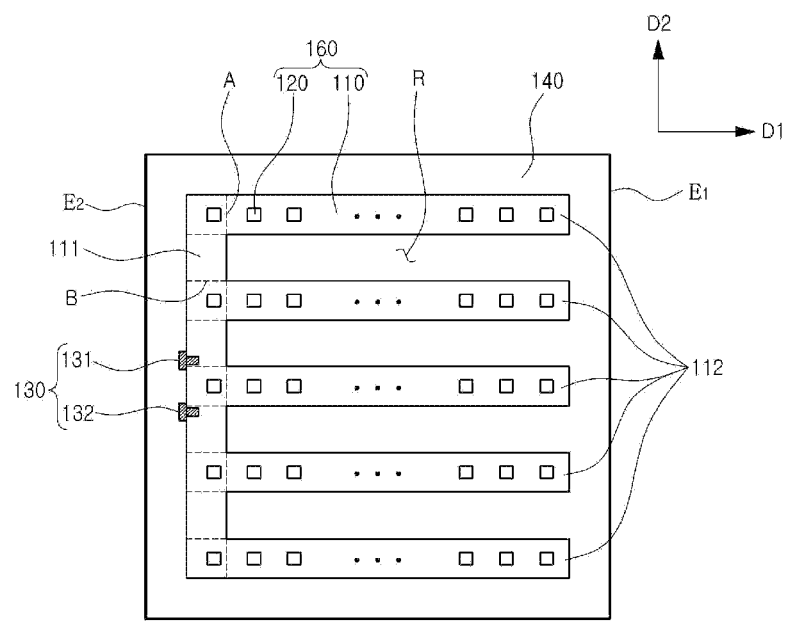
FIG. 2 is a bottom view illustrating the lighting apparatus in FIG. 1.

FIG. 2 is a bottom view illustrating a lighting apparatus according to an exemplary embodiment of the present invention.

Referring to FIG. 1 and FIG. 2, a lighting apparatus 100 according to an exemplary embodiment of the present invention includes a base plate 140 and a light emitting module 160. Additionally, the lighting apparatus 100 may further include a power supply 170 proving the light emitting module 160 with external electric power.

For example, the base plate 140 may have a rectangular shape. The base plate 140 may be coated with a material with white color or silver color to have high optical reflectivity. When the base plate 140 is coated with the material with white color and silver color, lighting efficiency may be improved.

The light emitting module 160 includes a printed circuit board (PCB) 110 and a plurality of optical semiconductor devices 120.

The PCB 110 is disposed on the base plate 140. An optical cover 150 may be disposed over the PCB 110 and contacting the base plate 140.

The optical semiconductor devices 120 are arranged in a row direction $D_1$ and in a column direction $D_2$ to be arranged in a matrix shape on the PCB 110.

The PCB 110 has opening portions R between the optical semiconductor 120 rows, so that the base plate 140 is exposed through the opening portions R. In this case, the opening portions R may extend along the row direction $D_1$. Further the opening portions R may extend to a first end portion $E_1$ of the PCB 110.

In other words, the PCB 110 may have a body 111 and m number of elbows 112 ('m' is an integer greater than one) integrally formed with the body 111. The elbows 112 are spaced apart from each other with the opening R, and the elbows 112 and the openings R are alternately disposed. In this case, the number of the openings R is smaller than the m number of elbows by one. The body 111 has a bar shape and is disposed adjacent to an edge portion. In detail the body 111 is disposed adjacent to a second end portion $E_2$ that is opposite to the first end portion $E_1$. The m number of elbows 112 extend from the body 111 toward the first end portion $E_1$. As described above, the body 111 and the elbows 112 may be divided by a vertical imaginary line A. However, when we define the elbows 112 having a bar shape, and the body 111 connects the elbows 112, the body 111 and the elbows 112 may be divided by a horizontal imaginary line B.

In each of the elbows 112, optical semiconductor devices 120 are arranged in a line to form an optical semiconductor device row, and the opening portion R is a space between the elbows 112.

In FIG. 2, the row direction $D_1$ and the column direction $D_2$ are perpendicular to each other. However, the row direction $D_1$ and the column direction $D_2$ may not be perpendicular to each other.

Further, the optical semiconductor devices 120 may be arranged in a line in each of the elbows 112 in FIG. 2. However, optical semiconductor devices 120 may be arranged in a plurality of lines in each of the elbows 112.

On the other hand, the PCB 110 is electrically connected through a pair of connectors 130 to provide the optical semiconductor devices 120 with external electric power. Therefore, according to the present invention, the number of the connectors 130 may be reduced to simplify a wiring and the base plate 140 is exposed through the opening R to improve heat dissipation of the base plate 140.

Hereinafter, an electric connection structure of the optical semiconductor devices 120 arranged in a matrix shape will be explained in detail.

Figure 3:
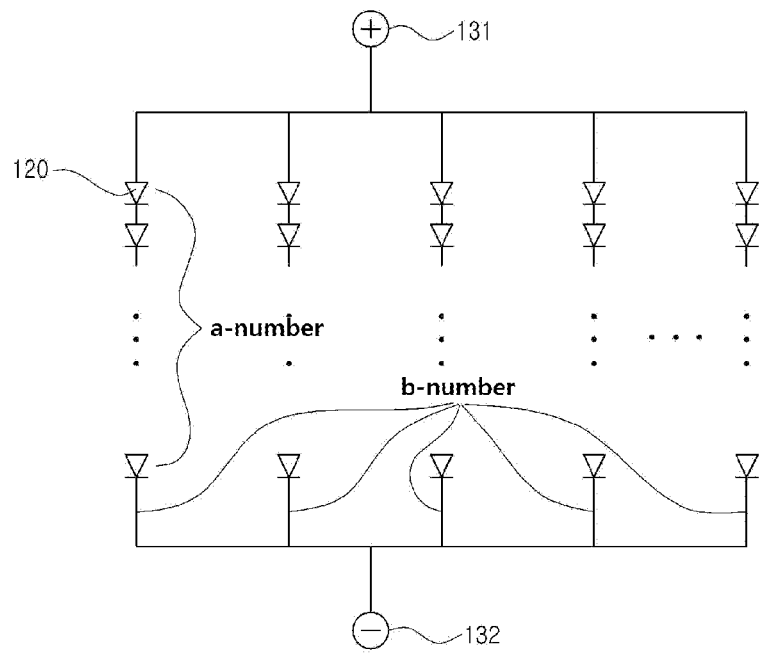
FIG. 3 is a circuit diagram illustrating an electrical connection structure of a×b number of optical semiconductor devices.

FIG. 3 is a circuit diagram illustrating an electrical connection structure of a×b number of optical semiconductor devices.

In the optical semiconductor devices 120 arranged in a matrix shape in FIG. 2, a-number of optical semiconductor devices 120 are electrically connected in series, and b-number of groups in each of which the a-number of optical semiconductor devices 120 electrically connected in series are electrically connected in parallel (hereinafter, this structure is referred to as 'a-serial b-parallel').

Through this electric connection structure, the power supply 170 in FIG. 1 effectively provides electric power to the optical semiconductor devices arranged in a matrix shape.

The optical semiconductor devices 120 in FIG. 2 according to an exemplary embodiment of the present invention may be electrically connected as follows. That is, the optical semiconductor devices 120 in the row direction may be divided into at least one lighting group, and optical semiconductor devices 120 in the same group may be electrically connected with each other in parallel, and the lighting groups may be electrically connected in series. That is, each of the m number of elbows 112 includes n number of lighting groups, each of which includes the same number of optical semiconductor devices 120 electrically connected with each other in parallel, and the n number of lighting groups are electrically connected with each other in series.

In this case, a lighting group in an elbow 112, which is adjacent to the first end portion $E_1$ may be electrically connected with a lighting group in a next elbow 112, which is adjacent to the second end portion $E_2$. In other words, a last lighting group of a (k−1)-th lighting block ('k' is an integer, and 2≤k≤m) is electrically connected with a first lighting group of a k-th lighting block in series. In this case, a lighting group in a first row or a first elbow, which is adjacent to the second end portion $E_2$ is electrically connected to a plus connector of the PCB 100, and a lighting group in a last row or a last elbow, which is adjacent to the first end portion $E_1$ is electrically connected to a minus connector of the PCB 100.

When the optical semiconductors 120 are connected as described above, electric currents flowing through each lighting group may be substantially the same.

For example, a case in which the PCB 110 has three elbows and the optical semiconductor devices 120 are connected with each other to have 'six serial three parallel' structure will be explained in detail referring to FIG. 4 and FIG. 5.

Figure 4:
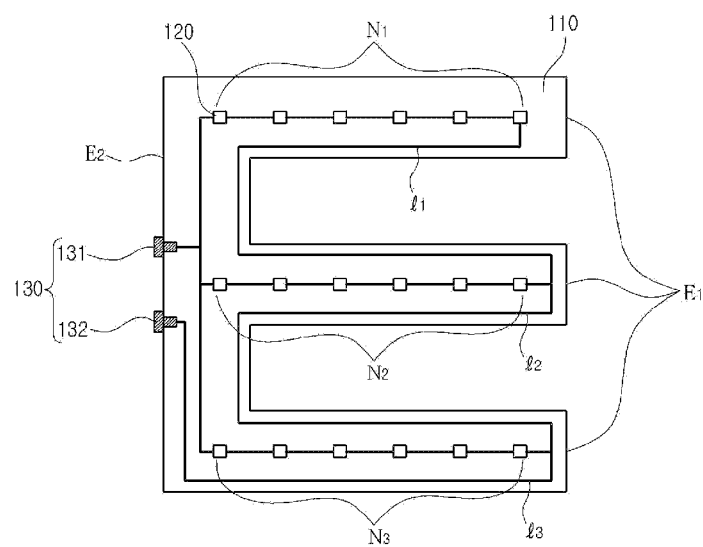
FIG. 4 is a bottom view illustrating an electrical connection structure of optical semiconductor devices on a PCB as shown in FIG. 2.
Figure 5:
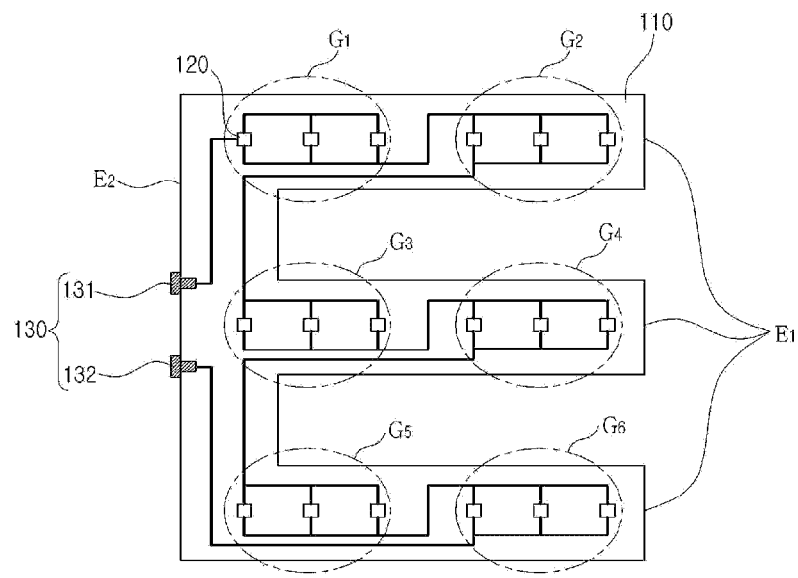
FIG. 5 is a bottom view illustrating an electrical connection structure of optical semiconductor devices on a PCB as shown in FIG. 2 according to an exemplary embodiment of the present invention.

FIG. 4 is a bottom view illustrating an electrical connection structure of optical semiconductor devices on a PCB in FIG. 2, and FIG. 5 is a bottom view illustrating an electrical connection structure of optical semiconductor devices on a PCB in FIG. 2 according to an exemplary embodiment of the present invention.

When electric connection structure of 'six serial three parallel' is required, six optical semiconductors 120 in one row (or one elbow) may be electrically connected with each other in series, and three lighting groups $N_1$, $N_2$ and $N_3$, each of which corresponds to each of elbows may be electrically connected with each other in parallel as shown in FIG. 4.

In detail, a first optical semiconductor device in each of the lighting groups $N_1$, $N_2$ and $N_3$ of three elbows, which is adjacent to the second end portion $E_2$, is electrically connected to the plus connector 131, and a last optical semiconductor device in each of the lighting groups $N_1$, $N_2$ and $N_3$ of three elbows, which is adjacent to the first end portion $E_1$, is electrically connected to the minus connector 132.

On the other hand, in order to connect the last optical semiconductor device in each of the lighting groups $N_1$, $N_2$ and $N_3$ of three elbows, which is adjacent to the first end portion $E_1$, to the minus connector 132, there is no other way except for different wiring length.

In detail, the last optical semiconductor device of the third lighting group $N_3$ of the third elbow is electrically connected to the minus connector 132 through a third wiring $l_3$.

On the other hand, the last optical semiconductor device of the second lighting group $N_2$ of the second elbow requires a second wiring $l_2$ to be is electrically connected to the third wiring $l_3$. Therefore, the last optical semiconductor device of the second lighting group $N_2$ of the second elbow is electrically connected to the minus connector 132 through the second wiring $l_2$ and the third wiring $l_3$. Therefore, the output wiring of the second lighting group $N_2$ of the second elbow is longer than the output wiring of the third lighting group $N_3$ of the third elbow by the second wiring $l_2$.

Further, the last optical semiconductor device of the first lighting group $N_1$ of the first elbow requires a first wiring $l_1$ to be electrically connected to the second wiring $l_2$. Therefore, the last optical semiconductor device of the first lighting group $N_1$ of the first elbow is electrically connected to the minus connector 132 through the first wiring $l_1$, the second wiring $l_2$ and the third wiring $l_3$. Therefore, the output wiring of the first lighting group $N_1$ of the first elbow is longer than the output wiring of the third lighting group $N_3$ of the third elbow by the first wiring $l_1$ and the second wiring $l_2$.

However, in order to connect the optical semiconductor devices 120 with each other to have 'six serial three parallel' structure according to an exemplary embodiment of the present invention, the optical semiconductor devices 120 in each elbow $N_1$, $N_2$, $N_3$ are divided into two lighting groups, and three optical semiconductor devices in each lighting group are connected with each other in parallel. Then, eighteen optical semiconductor devices are divided into six lighting groups $G_1$, $G_2$, ..., $G_6$, and the six lighting groups $G_1$, $G_2$, ..., $G_6$ are connected with each other in series.

And the first optical semiconductor device in the first group $G_1$, which is adjacent to the second end portion $E_2$, is electrically connected to the plus connector 131, and the last semiconductor device in the last group $G_6$, which is adjacent to the first end portion $E_1$, is electrically connected to the minus connector 132.

Figure 6:
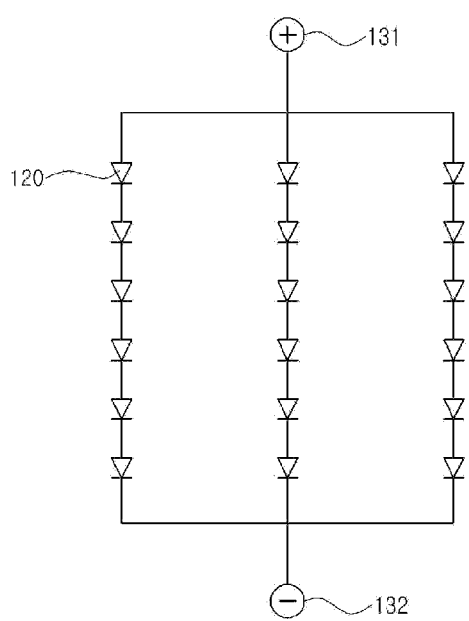
FIG. 6 is a circuit diagram illustrating the electrical connection structure of the optical semiconductor devices in FIG. 4.
Figure 7:
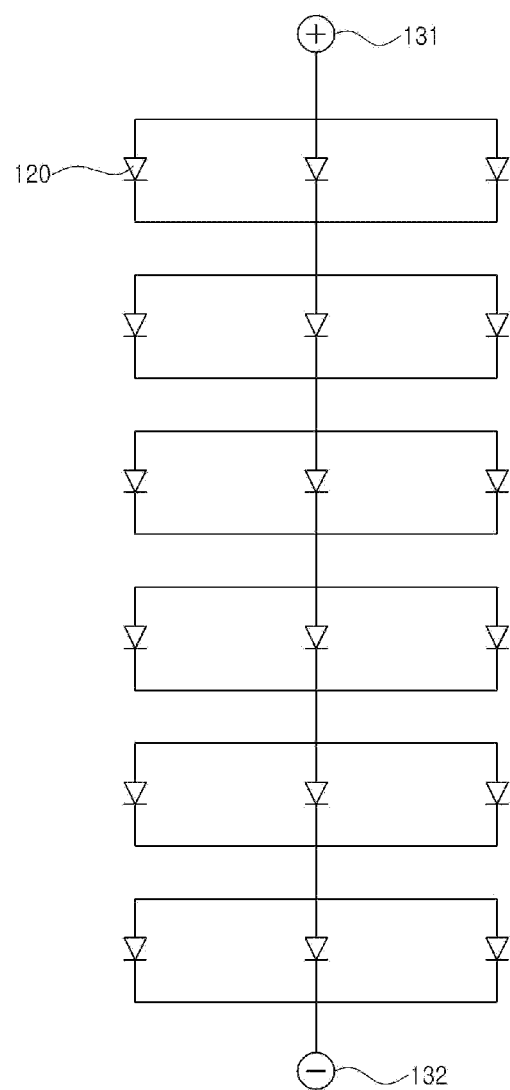
FIG. 7 is a circuit diagram illustrating the electrical connection structure of the optical semiconductor devices in FIG. 5.

The wiring structure in FIG. 5 may be simply express as a circuit diagram in FIG. 7. As shown in FIG. 7, the electric connection structure of the optical semiconductor devices in FIG. 7 is 'six serial three parallel' as in FIG. 6.

Figure 8:
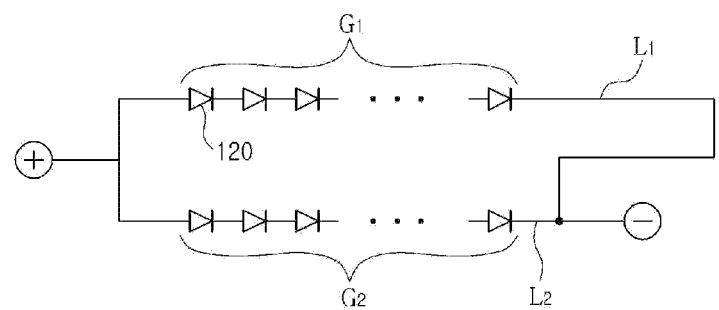
FIG. 8 and FIG. 9 are circuit diagrams for showing the difference of electrical connection structures of the optical semiconductor devices in FIG. 4 and FIG. 5.
Figure 9:
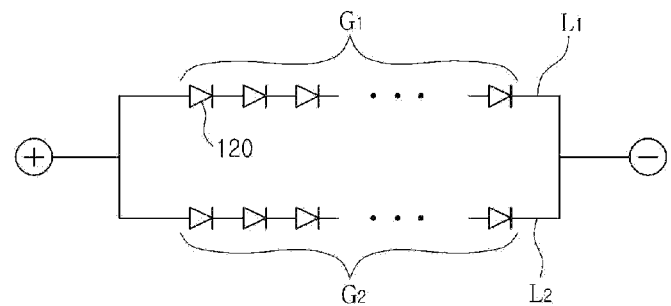

FIG. 8 and FIG. 9 are circuit diagrams for showing the difference of electrical connection structures of the optical semiconductor devices in FIG. 4 and FIG. 5.

In FIG. 8, the output wiring of a first lighting group $G_1$ has a first length $L_1$ and the output wiring of a second lighting group $G_2$ has a second length $L_2$ that is different from the first length $L_1$. On the other hand, the output wiring of a first lighting group $G_1$ and the output wiring of a second lighting group $G_2$ have the same length $L_1$ and $L_2$ in FIG. 9.

In real cases, the wiring has electric resistivity. Therefore, when the length of wiring increases, the electric resistance also increases. Therefore, the electric current flowing through the first lighting group $G_1$ is different from the electric current flowing through the second lighting group $G_2$.

In detail, the electric current flowing through the first lighting group $G_1$ which has relatively high electric resistance, is relatively smaller than the electric current flowing through the second lighting group $G_2$, since the voltage drop of first lighting group $G_1$, which is generated between the last optical semiconductor and the minus connector is greater than the voltage drop of second lighting group $G_2$, which is generated between the last optical semiconductor and the minus connector. As a result, the brightness of the optical semiconductors in the first lighting group $G_1$ is lower than the brightness of the optical semiconductors in the second lighting group $G_2$.

That is, the optical semiconductor devices of the lighting groups $N_1$, $N_2$ and $N_3$ of each elbow in FIG. 4 have different brightness with each other, but the optical semiconductor devices of the lighting groups $G_1$, $G_2$, ..., $G_6$ in FIG. 5 have same brightness.

Figure 10:
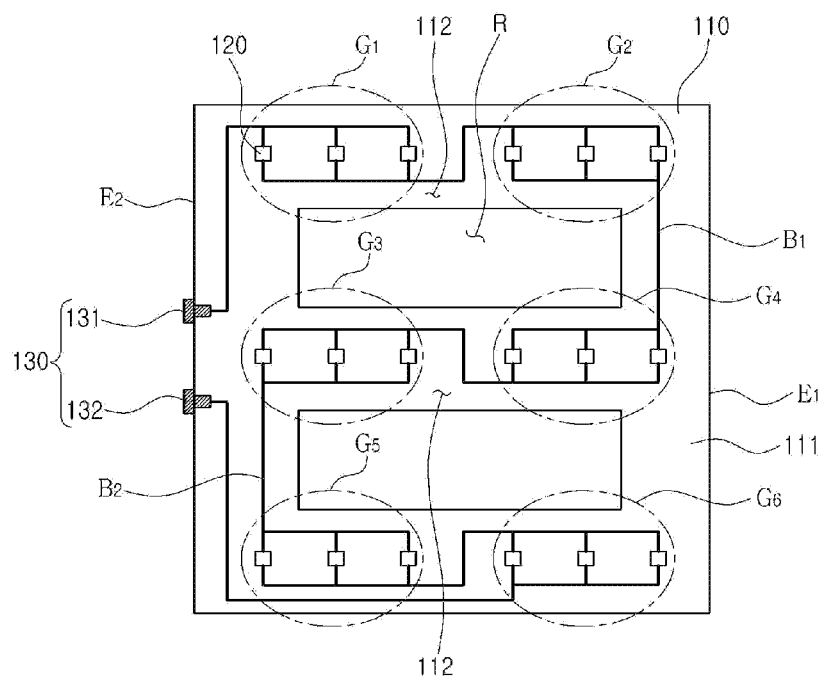
FIG. 10 is a bottom view illustrating an electrical connection structure of optical semiconductor devices according to another exemplary embodiment of the present invention.

FIG. 10 is a bottom view illustrating an electrical connection structure of optical semiconductor devices according to another exemplary embodiment of the present invention. The light emitting module of the present embodiment is substantially the same as that in FIG. 5 except for a shape of PCB and wiring patterns formed on the PCB. Thus, any repetitive explanation will be omitted.

Referring to FIG. 10, a PCB 110 according to another exemplary embodiment of the present invention has opening portion R disposed between rows of optical semiconductor devices 120, and a base plate 140 is exposed through the opening portion R. In this case, the opening portion R may extend along the row direction. However, the opening portion R does not reach a first end portion $E_1$ unlike the opening portion R of the PCB 110 in FIG. 5.

In other words, the PCB 110 has a pair of bodies 111 and a plurality of elbows 112. The pair of bodies 111 has a bar shape disposed at the first and second end portions $E_1$ and $E_2$, respectively. The plurality of elbows 112 connects the pair of bodies 111.

Each of the elbows 112 has optical semiconductors 120 arranged in a line to form optical semiconductor device row, and the opening portion R is disposed between the optical semiconductor device row.

The optical semiconductor devices 120 of a row is divided at least one lighting group, and the optical semiconductor device 120 in a same lighting group are electrically connected with each other in parallel, and the lighting groups are connected with each other in series. In this case, a lighting group of a row, which a disposed adjacent to the first end portion $E_1$ is electrically connected to a lighting group of a next row, which is disposed adjacent to the first end portion $E_1$, and a lighting group of a row, which a disposed adjacent to the second end portion $E_2$ is electrically connected to a lighting group of a next row, which is disposed adjacent to the second end portion $E_2$.

In detail, a last lighting group of an i-th elbow is electrically connected to a last lighting group of an (i+1)-th elbow (T is an odd number smaller than m), and a first lighting group of j-th elbow is electrically connected to a first lighting group of an (j+1)-th elbow ('j' is an even number smaller than m). In this case, the first lighting group means the lighting group disposed adjacent to the second end portion $E_2$, and the last lighting group means the light group disposed adjacent to the first end portion $E_1$.

For example, the second lighting group $G_2$ of a first row, which is adjacent to the first end portion $E_1$, is electrically connected to the fourth lighting group $G_2$ of a second row, which is adjacent to the first end portion $E_1$ through wiring $B_1$ formed at the body 111 with the first end portion $E_1$. The third lighting group $G_3$ of the second row, which is adjacent to the second end portion $E_2$, is electrically connected to the fifth lighting group $G_5$ of a third row, which is adjacent to the second end portion $E_2$ through wiring $B_2$ formed at the body 111 with the second end portion $E_2$.

On the other hand, the first lighting group $G_1$, which is adjacent to the second end portion $E_2$ is also electrically connected to the plus connector 131 of the PCB 110, and the last lighting group of last row, which is adjacent to the first end portion $E_1$ or the second end portion $E_2$, is also electrically connected to the minus connector 132.

In detail, when the number of elbow is odd number, the lighting group of the last row, which is adjacent to the first end portion $E_1$, is electrically connected to the minus connector 132. On the contrary, when the number of elbow is even number, the lighting group of the last row, which is adjacent to the second end portion $E_2$, is electrically connected to the minus connector 132.

Comparing the light emitting module of the present embodiment with the light emitting module in FIG. 5, the light emitting module has relatively longer wiring length, so that the voltage drop between the last optical semiconductor device and the minus connector becomes relatively greater, so that electric currents is reduced relatively more to lower the brightness relatively more, but the light emitting module has relatively shorter wiring length, so that the voltage drop between the last optical semiconductor device and the minus connector becomes relatively smaller, so that electric currents is reduced relatively little to lower the brightness relatively little.

Figure 11:
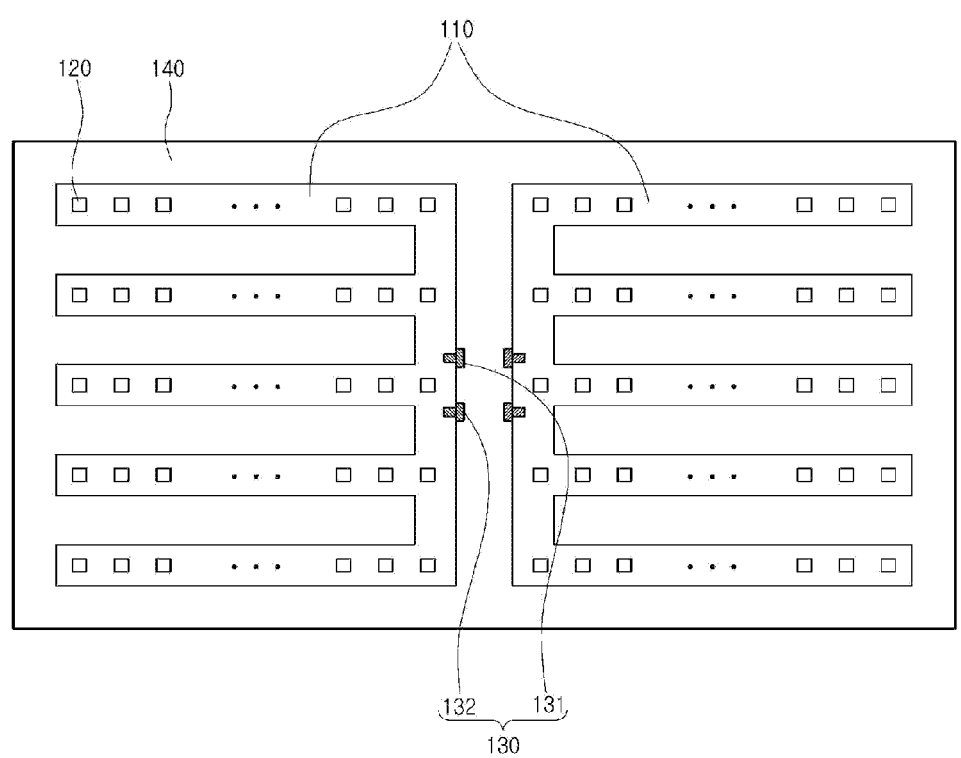
FIG. 11 and FIG. 12 are bottom views illustrating a lighting apparatus according to exemplary embodiments of the present invention.
Figure 12:
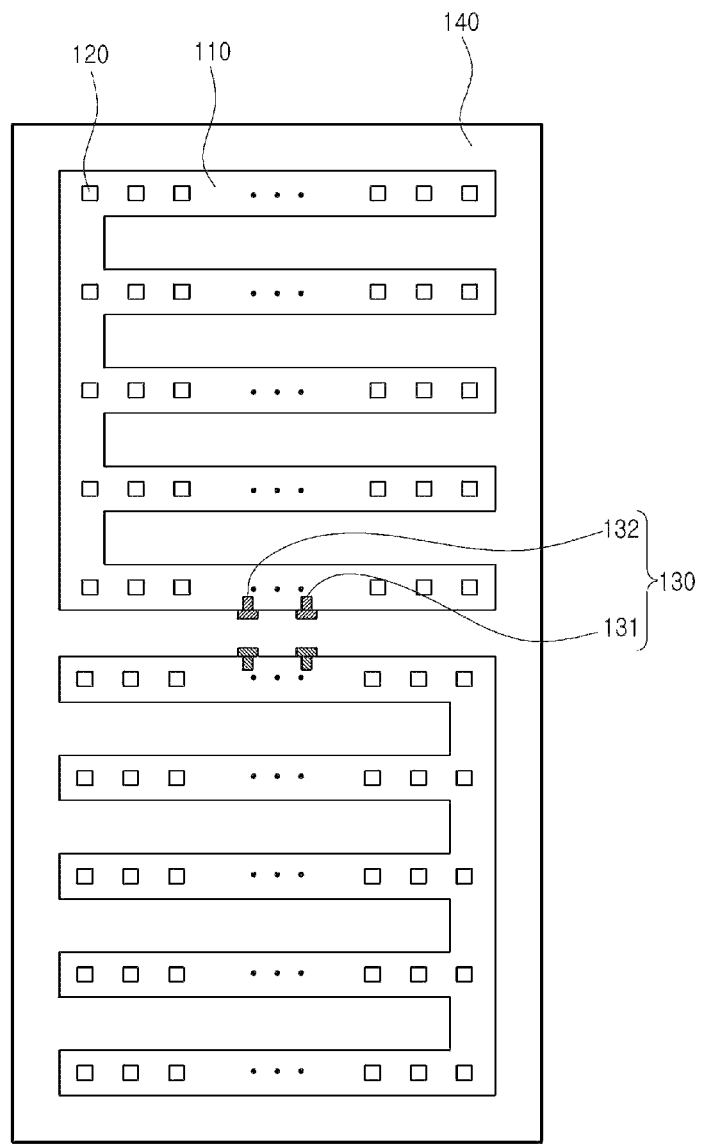

FIG. 11 and FIG. 12 are bottom views illustrating a lighting apparatus according to exemplary embodiments of the present invention.

The lighting apparatus of the present exemplary embodiments is substantially same as the lighting apparatus of the previous embodiments except for light emitting module and arrangement thereof. Thus, any repetitive explanation will be omitted.

Referring to FIG. 11 and FIG. 12, the lighting apparatus of present exemplary embodiments includes a plurality of light emitting modules. In this case, the light emitting modules may be arranged such that bodies of the light emitting modules are adjacent to each other as shown in FIG. 11. However, the light emitting modules may be arranged such that elbows of the light emitting modules are adjacent to each other as shown in FIG. 12.

When the light emitting modules are arranged as shown in FIG. 11, the connector 130 may be formed at the body, and the light emitting modules are arranged as shown in FIG. 12, the connector 130 may be formed at the elbow.

The exemplary embodiments shown in FIG. 11 and FIG. 12 may be modified as described above with reference to the exemplary embodiments described in FIG. 5 to FIG. 10.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A lighting apparatus, comprising:
    a base plate having a rectangular shape; and
    a light emitting module comprising a printed circuit board (PCB) disposed on the base plate and optical semiconductor devices disposed on the PCB, the PCB comprising a body and 'm' number of elbows integrally formed with the body,
    wherein 'm' is an integer greater than one,
    wherein the 'm' number of elbows are spaced apart with opening portions respectively interposed therebetween so that the elbows and the opening portions are alternately disposed,
    wherein each of the elbows comprises 'n' number of lighting groups, each of the lighting groups comprising the same number of optical semiconductor devices, and
    wherein an electric current configured to flow through each lighting group is substantially the same.

2. The lighting apparatus of claim 1, wherein the lighting groups are electrically connected with each other in series.

3. The lighting apparatus of claim 2, wherein the optical semiconductor devices in each of the lighting groups are electrically connected with each other in parallel.

4. The lighting apparatus of claim 3, wherein a last lighting group of a (k−1)-th elbow, wherein 'k' is an integer, and 2≤k≤m, is electrically connected with a first lighting group of a k-th elbow in series.

5. The lighting apparatus of claim 3, wherein a last lighting group of an i-th elbow is electrically connected to a last lighting group of an (i+1)-th elbow, wherein 'i' is an odd number smaller than 'm', and
    a first lighting group of j-th elbow is electrically connected to a first lighting group of an (j+1)-th elbow, wherein T is an even number smaller than 'm'.

6. The lighting apparatus of claim 1, wherein the body is disposed in parallel with an edge portion of the base plate, and comprises at least one connector.

7. The lighting apparatus of claim 1, wherein the 'm' number of elbows are disposed in parallel with an edge portion of the base plate, and one of the elbows comprises at least one connector.

8. The lighting apparatus of claim 1, wherein a white or silver colored material having a high optical reflectivity is disposed on the base plate.

9. The lighting apparatus of claim 1, further comprising a power supply disposed on a first surface of the base plate opposite to a second surface on which the PCB is disposed.

10. The lighting apparatus of claim 1, further comprising an optical cover combined with the base plate to diffuse light generated by the optical semiconductor devices.

* * * * *